US006969676B2

(12) United States Patent
Schwan et al.

(10) Patent No.: US 6,969,676 B2

(45) Date of Patent: Nov. 29, 2005

(54) METHOD OF ADJUSTING ETCH SELECTIVITY BY ADAPTING ASPECT RATIOS IN A MULTI-LEVEL ETCH PROCESS

(75) Inventors: Christoph Schwan, Gebhardshain (DE); Gunter Grasshoff, Radebeul (DE); Volker Grimm, Langebrueck (DE)

(73) Assignee: Advanced Micro Devices, Inc., Austin, TX (US)

(*) Notice: Subject to any disclaimer, the term of this patent is extended or adjusted under 35 U.S.C. 154(b) by 22 days.

(21) Appl. No.: 10/744,439

(22) Filed: Dec. 23, 2003

(65) Prior Publication Data

US 2004/0241984 A1 Dec. 2, 2004

(30) Foreign Application Priority Data

May 28, 2003 (DE) ................................ 103 24 434

(51) Int. Cl.[7] ........................................... H01L 21/4763

(52) U.S. Cl. ....................................... 438/637; 438/675

(58) Field of Search ................................ 438/637, 639, 438/647, 652, 666, 672, 675

(56) References Cited

U.S. PATENT DOCUMENTS

| | | | | |
|---|---|---|---|---|
| 5,562,801 A * | 10/1996 | Nulty | 438/695 |
| 5,892,286 A | 4/1999 | Toyoda et al. | 257/775 |
| 5,908,320 A | 6/1999 | Chu et al. | 438/743 |
| 6,472,717 B1 * | 10/2002 | Jeng et al. | 257/410 |
| 2002/0142526 A1 | 10/2002 | Khare et al. | 438/152 |
| 2004/0222465 A1 * | 11/2004 | Matsumoto et al. | 257/347 |

* cited by examiner

*Primary Examiner*—Phuc T. Dang

(74) *Attorney, Agent, or Firm*—Williams, Morgan & Amerson, P.C.

(57) ABSTRACT

The present invention discloses a technique for controlling a local etch rate in forming multi-level contact openings, for example, in forming substrate contact openings and transistor contact openings of an SOI device. The aspect ratio dependent etch rate is correspondingly adapted by selecting in advance suitable aspect ratios for the contact openings so that the etch front may reach the respective final depth within a limited time interval.

28 Claims, 4 Drawing Sheets

METHOD OF ADJUSTING ETCH SELECTIVITY BY ADAPTING ASPECT RATIOS IN A MULTI-LEVEL ETCH PROCESS

BACKGROUND OF THE INVENTION

1. Field of the Invention

The present invention relates to the field of manufacture of integrated circuits, and, more particularly, to the formation of contact plugs requiring a multi-level etch procedure as is the case, for example, for substrate contacts and device contacts of circuit elements formed on an insulating substrate, such as silicon-on-insulator (SOI) devices.

2. Description of the Related Art

In modern integrated circuits, the number and, hence, the packing density of circuit elements, such as field effect transistors, is steadily increasing and, as a consequence, performance of these integrated circuits is currently improving. The increase in packing density and signal performance of integrated circuits requires the reduction of critical feature sizes, such as the gate length and, thus, the channel length, of field effect transistors to minimize the chip area occupied by a single circuit element and to reduce signal propagation delay owing to a delayed channel formation. However, currently, critical feature sizes are approaching 0.1 $\mu$m and less and a further improvement in circuit performance by reducing the sizes of the transistor elements is partially offset by parasitic capacitances of the transistors formed in bulk silicon substrates.

In order to meet the ever-increasing demands with respect to device and circuit performance, circuit designers have proposed new device architectures. One technique to improve performance of a circuit, for example of a CMOS device, is to manufacture the circuit on a so-called silicon-on-insulator (SOI) substrate, wherein an insulating layer is formed on a bulk substrate, for example a silicon substrate or glass substrate, wherein the insulating layer frequently comprises silicon dioxide (also referred to as a buried oxide layer). Subsequently, a silicon layer is formed on the insulating layer in which an active region for a field effect transistor device is defined by shallow trench isolations. A correspondingly fabricated transistor is electrically entirely isolated from the regions surrounding the transistor area. Contrary to a conventional device formed on a bulk semiconductor substrate, the precise spatial confinement of the active region of the SOI device significantly suppresses parasitic effects known from conventional devices, such as latch-up and leakage currents drifting into the substrate. Moreover, SOI devices are characterized by lower parasitic capacitances compared to devices formed on a bulk semiconductor substrate and, hence, exhibit an improved high frequency performance. Furthermore, due to the significantly reduced volume of the active region, radiation-induced charge carrier generation is also remarkably reduced and renders SOI devices extremely suitable for applications in radiation-intensive environments.

On the other hand, the advantages of SOI devices over conventionally fabricated devices may partially be offset by the so-called floating body effect, wherein the substrate of the device is not tied to a defined potential, which may lead to an accumulation of charge carriers, thereby adversely affecting the transistor characteristics, such as the threshold voltage, single-transistor-latch-up, and the like. Therefore, so-called substrate contacts are frequently formed to provide a connection to the substrate to drain off the excess charge.

With reference to FIGS. 1*a* and 1*b*, a typical conventional process flow for forming a substrate contact and contacts to a circuit element will now be described in more detail. In FIG. 1*a*, a semiconductor device 100 is schematically shown in a cross-sectional view. The semiconductor device 100 comprises an SOI substrate 101, which in turn includes a crystal-line silicon layer 102 that is typically provided in the form of a bulk silicon substrate with an insulation layer 103 formed thereon. The insulation layer 103 may often be referred to as a buried oxide layer, since, typically, the insulating layer 103 may be comprised of silicon dioxide. However, the insulating layer 103 may include other insulating materials, such as silicon nitride and the like, depending on the process for forming the SOI substrate 101. The SOI substrate 101 further includes a semiconducting layer 104 having a thickness that allows the formation of circuit elements such as a field effect transistor 110. The semiconducting layer 104 may be formed from a variety of materials, e.g., crystalline silicon, silicon-germanium, or any III-V and II-VI semiconductors in crystalline form, etc.

The field effect transistor 110 is enclosed by a trench isolation structure 105 that includes an insulating material, such as silicon dioxide and/or silicon nitride. For convenience sake, merely one cross-section of the trench isolation structure 105 is depicted. Thus, the field effect transistor 110 is formed on a respective silicon island that may be completely insulated from other circuit elements by the trench isolation structure 105 and the insulating layer 103. The field effect transistor 110 may include a gate electrode 111 that is separated from a channel region 113 by a gate insulation layer 112. Moreover, drain and source regions 114 may be provided within the silicon layer 104 and sidewall spacers 115 may be located at sidewalls of the gate electrode 111. The channel region 113, the drain and source regions 114 and the gate electrode 111 may comprise a dopant material with an appropriate concentration so as to provide the desired electrical performance of the transistor 110. Moreover, metal silicide regions (not shown) may be formed on top of the source and drain regions 114 and the gate electrode 111 to minimize the resistance of these regions.

The semiconductor device 100 further comprises a dielectric layer 107, wherein a thickness of the dielectric layer 107 is selected such that the transistor 110 is completely embedded within the dielectric layer 107. The dielectric layer 107 may be comprised of silicon dioxide. In some cases, a thin dielectric layer (not shown) may be provided between the dielectric layer 107 and the transistor 110. Typically, the composition and thickness of this optional dielectric layer may be selected so as to act as a bottom anti-reflective coating in a subsequent lithography process for forming contacts to the transistor 110 and to the silicon layer 102 of the SOI substrate 101. Moreover, the optional dielectric layer may act as an etch stop layer during the formation of the contact openings. A resist layer 108 is formed above the dielectric layer 107 and has openings 109 with dimensions that substantially represent the dimensions of corresponding contact openings to be formed.

A typical process flow for manufacturing the semiconductor device 100 as shown in FIG. 1*a* may comprise the following processes. The SOI substrate 101 may be formed by sophisticated wafer bonding techniques and may be purchased from corresponding manufacturers in a condition that allows the subsequent formation of the transistor 110. Then, the trench isolation structure 105 may be formed by well-established photolithography, etch and deposition techniques to define a lithography resist mask, etch respective trenches, and subsequently deposit one or more insulating materials to fill the trenches, thereby forming the trench isolation structure 105. Thereafter, any excess material may be removed by chemical mechanical polishing (CMP), thereby also planarizing the substrate surface. Afterwards, the gate insulation layer 112 may be formed by sophisticated oxidation and/or deposition processes as are well known in the art. Subsequently, the gate electrode 111 may be formed by well-known lithography and etch techniques and implantation cycles may be carried out so as to form the drain and source regions 114 with a required dopant profile, wherein, depending on the process sequence used, the spacer elements 115 may be formed prior, during or after the implantation sequence. The implanted dopants are then activated and lattice damage is cured by anneal cycles with a specified temperature and duration.

Then, metal silicide portions may be formed in the drain and source regions 114 and the gate electrode 111 by well-established silicidation processes. After the completion of the transistor 110, the optional dielectric layer may be deposited, for instance by chemical vapor deposition (CVD), wherein a thickness and a material composition is selected so as to provide the required optical characteristics and/or the desired etch selectivity to the dielectric layer 107 in a subsequent anisotropic etch process. Thereafter, the dielectric layer 107 may be deposited and may be planarized by CMP to provide for a substantially planar surface. Next, the resist layer 108 is formed and patterned in accordance with well-established photo-lithography techniques to define the openings 109.

Subsequently, an etch process sequence is performed to create contact openings in the dielectric layer 107 that connect to the gate electrode 111 and the drain or source region 114, and to create a substrate contact opening that connects to the silicon layer 102. To this end, in one typical approach, an anisotropic etch process is carried out to commonly form the contact openings in the dielectric layer 107, wherein the anisotropic etch process is substantially stopped at or within the optional dielectric layer, if provided. Alternatively, if the optional dielectric layer is not provided or if an anisotropic etch process recipe is used that does not exhibit a specific selectivity between the dielectric layer 107 and the optional dielectric layer, the process may be designed to exhibit a significant selectivity between silicon and silicon dioxide to stop the etch process in the gate electrode 111 and the source region 114, thereby possibly removing silicide prior to reaching the doped polysilicon and the crystalline silicon, respectively, while the etch process in the trench isolation structure 105, substantially comprised of silicon dioxide, still proceeds until the silicon layer 102 is reached. Irrespective of the etch scheme selected, at least during the etch of the lower portion of the substrate contact opening, a high selectivity between silicon and silicon dioxide is required. Thereafter, the resist layer 108 is removed, for example by plasma etching and a subsequent wet chemical clean process. Hence, the process for forming the substrate contact opening and transistor contact openings requires an etch procedure through a plurality of layers, thereby rendering the contact etch quite complex. Therefore, a great burden is placed on the selective etch process so as to reliably define the corresponding contact openings in a common etch process, thereby restricting process margins and reducing yield of the etch process.

FIG. 1*b* schematically shows the semiconductor device 100 after the above-described sequence is completed. Thus, the semiconductor device 100 comprises a substrate contact opening 120, a gate contact opening 121 and, for example, one contact opening 122 connecting to the source region 114 of the transistor 110. Subsequently, the openings 120, 121 and 122 may be filled with a highly conductive material, such as tungsten, which is presently considered a preferred candidate for a contact metal of high-end, copper-based devices due to the superior thermal stability of tungsten compared to, for example, aluminum, to connect circuit elements to further metallization layers (not shown) of the semiconductor device 100. The tungsten may be filled in by well-established deposition techniques, such as chemical and physical vapor deposition techniques. Thereafter, excess tungsten is removed by a CMP (chemical mechanical polishing) process, thereby also planarizing the substrate surface for the further processing of the device 100 so as to form one or more metallization layers.

Thus, a highly conductive contact to the substrate is achieved, requiring, however, a highly selective etch procedure for commonly defining all of the contact openings, thereby rendering the conventional approach non-efficient in view of reliability.

Due to the plurality of superior characteristics of SOI devices compared to devices formed on bulk silicon substrates and due to the availability of SOI substrates at low cost having silicon layers formed thereon with high quality, the development of SOI devices will gain in importance. Thus, an urgent need exists for an improved contact etch technique that allows the formation of multi-level contacts, for example, including a substrate contact, while eliminating or at least reducing one or more of the above-identified problems concerning a reliable multi-level etch process.

SUMMARY OF THE INVENTION

Generally, the present invention is directed to a technique that enables the control of the etch rate in forming openings having a high aspect ratio. The present invention takes advantage of the fact that in an anisotropic etch procedure for forming high aspect ratio openings, the etch rate may significantly depend on the aspect ratio. That is, by appropriately selecting the aspect ratio of the opening finally obtained, openings having different etch depths may be realized in a common etch procedure, thereby "simulating" a high degree of etch selectivity or enhancing a given etch selectivity between two materials, such as silicon and silicon dioxide.

Thus, according to one illustrative embodiment of the present invention, a method comprises defining a lateral dimension for a given first depth of a first contact opening and a second lateral dimension for a given second depth of a second contact opening, wherein the first depth differs from the second depth. A resist mask is formed over a dielectric layer in which the first and second openings are to be formed, wherein the resist mask has a first opening with the first lateral dimension and a second opening with the second lateral dimension. Moreover, the first and second contact openings are etched through the first and second openings of the resist mask into the dielectric layer, wherein a local etch rate of a specified anisotropic etch recipe is controlled by the first and second lateral dimensions.

According to still another illustrative embodiment of the present invention, a method of defining lateral dimensions of at least two contact openings of different depth to be formed in a common etch process in a dielectric layer is provided. The method comprises determining an etch rate of the common etch process for a plurality of openings having a different lateral dimension and defining an allowable time interval within which the common etch process has to reach the different depths. Finally, an actual lateral dimension for each of the at least two contact openings is estimated on the basis of the determined etch rates, wherein the actual lateral dimensions allow one to reach the different depths within the allowable time interval.

In a further illustrative embodiment of the present invention, an SOI semiconductor device comprises a trench isolation structure, a field effect transistor enclosed by the trench isolation structure and a dielectric layer formed adjacent and above the trench isolation structure and the field effect transistor. Moreover, the SOI semiconductor device further includes a substrate contact plug extending through the trench isolation structure, a first contact plug connecting to a gate electrode of the field effect transistor and a second contact plug connecting to a source region of the field effect transistor, wherein a lateral dimension of the substrate contact plug, the first contact plug and the second contact plug differ from each other.

BRIEF DESCRIPTION OF THE DRAWINGS

The invention may be understood by reference to the following description taken in conjunction with the accompanying drawings, in which like reference numerals identify like elements, and in which.

Figure 1A:
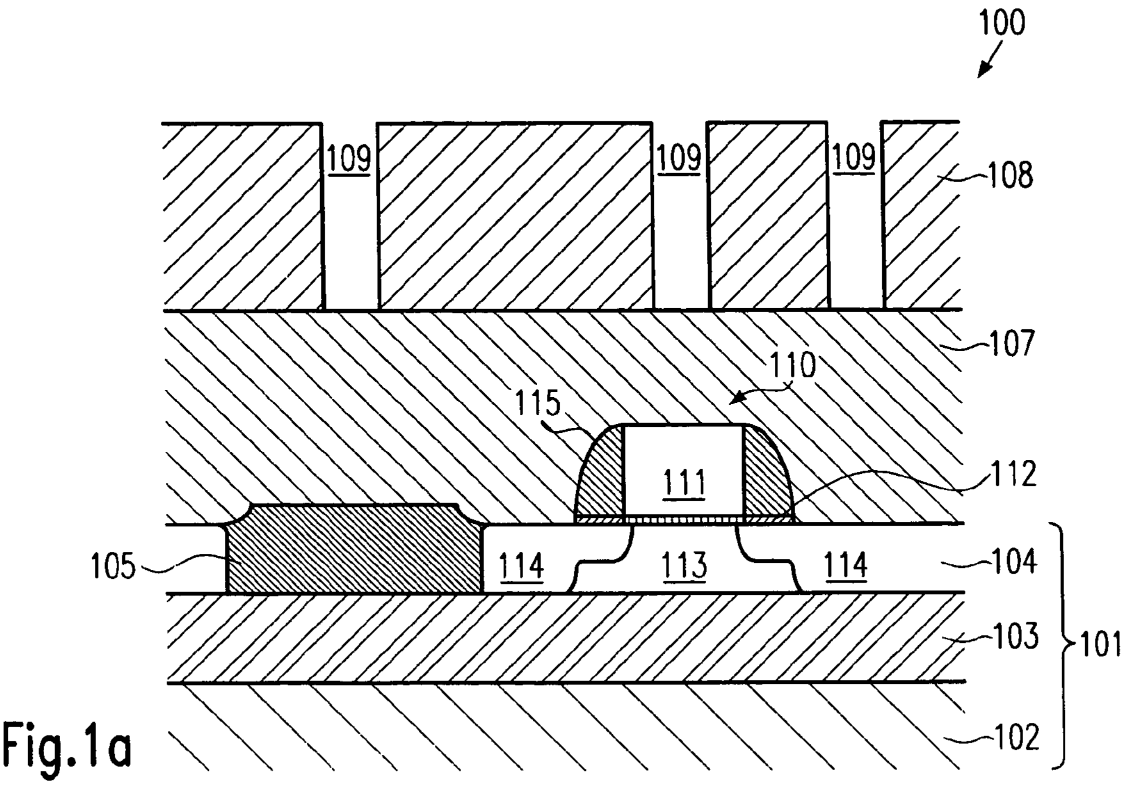
FIGS. 1*a* and 1*b* schematically show cross-sectional views of conventional SOI transistor elements during the formation of contact plugs according to a conventional three-level etch process.
Figure 1B:
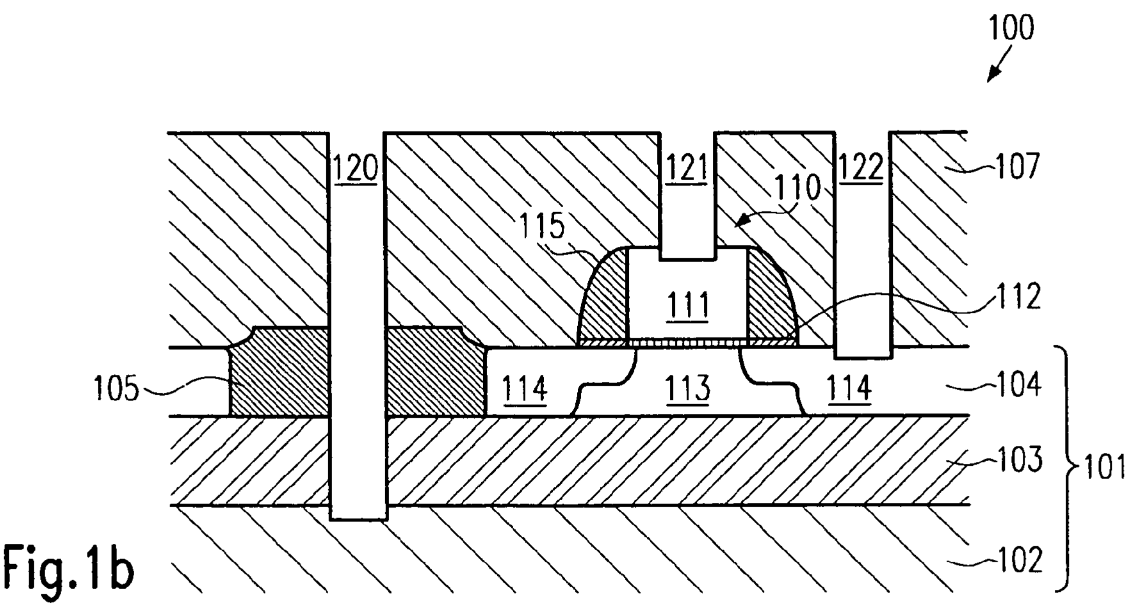

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is based on the concept of exploiting the per se undesired characteristics of a typical anisotropic etch process to exhibit a structure-dependent etch rate. That is, generally, the etch rate is dependent upon the amount of etchable surface area exposed to the reactive gases within a plasma atmosphere of a dry etch process chamber. This phenomenon is frequently referred to as "loading" and may have a significant influence on the etch characteristics and has to be taken into consideration when establishing a specified etch recipe for a certain type of substrate. Moreover, it turns out that the etch rate is not only dependent on the total amount of etchable surface area but is also affected by the feature size and the pattern density provided on the substrate to be etched. For the case of contact holes, for instance, the etch rate within isolated contact holes may be significantly higher than in contact holes arranged in a dense array due to the lack of reactants in the dense contact hole array compared to the isolated contact hole. This effect is often referred to as "microloading" and requires specifically designed etch recipes regarding process parameters, such as plasma density, chamber pressure, composition of reactants, chamber geometry, and the like, so as to minimize the etch rate difference between dense and isolated features.

A similar effect can be observed when feature sizes approach 0.25 μm and less as is the case in sophisticated semiconductor devices. It turns out that contact holes having a lateral dimension, that is, a diameter, or a width and a length when non-circular geometries are considered, of 0.25 μm and less with a depth of 0.5 μm and more, may "experience" different etch rates, wherein the difference depends on the geometry of the contact holes. The ratio of the depth of an opening and a characteristic lateral dimension, such as diameter of a substantially circular contact hole or a representative average of the width and length of any other geometry, is referred to as aspect ratio. It turns out that the etch rate is generally dependent on the aspect ratio resulting in the fact that, for example, small contact openings etch more slowly than larger ones which is often referred to as RIE (reactive ion etching) lag. Thus, high aspect ratio holes subjected to an anisotropic etch process etch more slowly than low aspect ratio contact holes, especially when the aspect ratio is higher than 2 with a lateral dimension of less than 1 μm.

According to the present invention, the difference in the etch rate for contact openings having a different aspect ratio may be taken advantage of when two or more contact holes have to be formed to very different depths, which usually requires an extremely high degree of selectivity, since the etch process has to be reliably stopped at the first depth without unduly damaging the material at the first depth until the etch process has reached the second depth. By correspondingly adapting the aspect ratios of the different contact openings—while taking into consideration design specific constraints for the contact openings—the etch rate may be controlled so as to virtually increase the selectivity of the etch procedure as the etch front may reach the first depth and the second depth within a predefined time interval, thereby significantly relaxing the demands with respect to etch selectivity.

In the following detailed description, the principles of the present invention will be described with reference to the formation of contact holes for a substrate contact and transistor contact plugs for an SOI device, since in this application, the present invention is particularly advantageous as this contact hole formation process typically requires a three-level etch procedure with an extremely high selectivity of the etch recipe with respect to silicon dioxide and silicon. It should be borne in mind, however, that the present invention is applicable to any contact hole etch process requiring the formation of openings having a different depth in a common etch process, when the circuit design allows for a certain degree of freedom regarding the aspect ratio, that is, the lateral dimension for a given depth, of the contact openings.

Figure 2A:
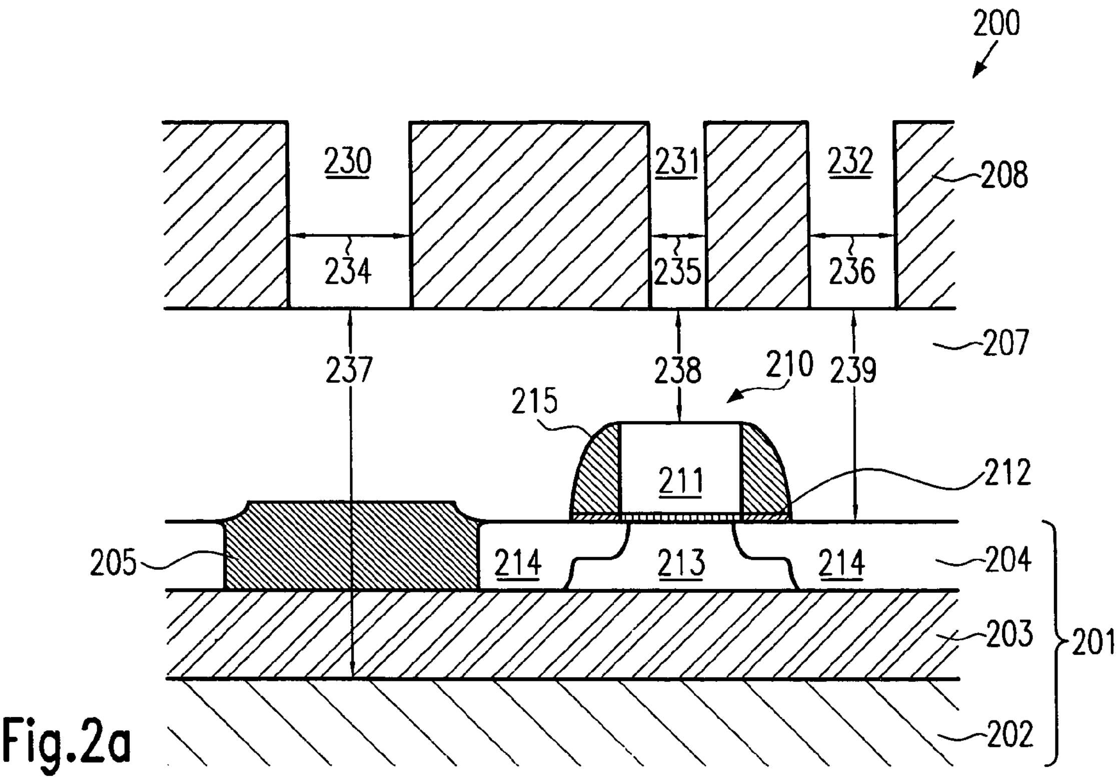
FIGS. 2*a* and 2*b* schematically show cross-sectional views of the formation of contact plugs in accordance with a three-level etch procedure pursuant to illustrative embodiments of the present invention.

FIG. 2*a* schematically shows a semiconductor device 200 comprising an SOI substrate 201, which includes a bulk substrate layer 202, a buried insulating layer 203 and an active or semiconductor layer 204, such as a silicon layer. A trench isolation structure 205 is formed in the active layer 204, wherein, for convenience sake, merely one cross-section of the trench isolation structure 205 is depicted. The trench isolation structure 205 may be substantially comprised of silicon dioxide or any other appropriate insulating material. Enclosed by the trench isolation structure 205 is a field effect transistor 210 including a gate electrode 211 that is separated by a gate insulation layer 212 from a channel region 213. Highly doped drain and source regions 214 are formed adjacent to the channel region 213. Spacer elements 215 may be formed on the sidewalls of the gate electrode 211. An insulating layer 207 is formed above the silicon layer 204 so as to surround the field effect transistor 210. The insulating layer 207 may be comprised of silicon dioxide, wherein, optionally, a thin dielectric layer (not shown) may be formed so as to underlie the insulating layer 207 and separate it from the silicon layer 204, the trench isolation structure 205 and the field effect transistor 210. A resist layer 208 is formed above the insulating layer 207 and is patterned to have openings 230, 231 and 232 that are located at positions at which corresponding contact openings are to be formed.

A typical process flow for forming the semiconductor device 200 as shown in FIG. 2*a* may comprise substantially the same processes as are described with reference to FIG. 1*a*, except for the photolithography for forming the openings 230, 231 and 232. Thus, the description of these identical or substantially identical processes is omitted here. Contrary to the conventional technique, however, the formation of the opening 230 is performed so as to adapt a lateral dimension, indicated by 234, to a depth, denoted as 237, of the contact opening to be formed in this area of the semiconductor device 200. Since the contact opening, to be formed by means of the opening 230, is intended to represent a substrate contact, the corresponding substrate contact opening has to extend at least through the insulating layer 207, the trench isolation structure 205, the buried insulating layer 203 into contact with the bulk substrate layer 202.

On the other hand, a contact opening is to be formed by means of the opening 231 having a lateral dimension, denoted as 235, through a first portion of the insulating layer 207 to a depth located at the gate electrode 211, denoted as 238, to connect to the gate electrode 211. Moreover, a further contact opening may be formed through the entire insulating layer 207, the corresponding depth is denoted as 239, so as to connect to the silicon layer 204 by means of the opening 232 having a lateral dimension, indicated by 236.

Since the contact openings have to be formed in a common etch process, the lateral dimensions 234, 235 and 236 are selected differently from each other so as to correspond to the respective etch depths 237, 238 and 239. Hence, respective ratios of the contact openings to be formed are preselected by determining the lateral dimension 234, 235, 236, wherein "start" aspect ratios are given by a thickness of the resist layer 208 and the lateral dimensions 234, 235, 236. As previously pointed out, the etch rate may depend on the aspect ratio of an opening during the etch procedure and thus the lateral dimension 234 is selected to be largest so as to compensate for the elongated etch depth 237. Similarly, the lateral dimension 235 is selected smallest so as to correspond to the smallest etch depth 238. It should be noted that at the beginning of the etch process, the etch rates within the openings 230, 231 and 232 are affected by the corresponding start aspect ratios of these openings. Moreover, during the progression of the etch process, material of the insulating layer 207 is increasingly removed, thereby steadily increasing the aspect ratio of the respective openings so that the etch rate at each opening varies with time. It should be appreciated that material of the resist layer 208 is also consumed during the etch process, wherein resist removal is significantly lower than removal of silicon dioxide of the insulating layer 207. Thus, though a thickness of the resist layer 208 will decrease during the etch process, in total, the aspect ratios of the corresponding openings increase with time.

The selection of the corresponding lateral dimensions 234, 235 and 236 not only requires the consideration of the corresponding etch depths 237, 238 and 239, but also necessitates the consideration of design requirements. For instance, a minimum desired conductivity of the respective contact plugs may call for a minimum lateral dimension that must be maintained. Moreover, the device dimensions, for instance of the trench isolation structure 205 and of the field effect transistor 210, may restrict the available lateral extension of a corresponding contact opening. For example, the lateral extension of the source region 214 may dictate a maximum lateral extension of a corresponding contact opening. In some embodiments, however, the design of the semiconductor device 200 may take into consideration the different lateral dimensions 234, 235 and 236 by, for example, correspondingly designing the trench isolation structure 205 so as to exhibit an increased lateral dimension, or by adapting the transistor design of the field effect transistor 210 so as to allow more flexibility in selecting the lateral dimensions 235 and 236. Other secondary conditions in determining the lateral dimensions 234, 235 and 236 may include the influence of the corresponding lateral dimensions on sidewall profiles of the respective openings and on the selectivity of the etch process with respect to silicon and silicon dioxide. Further illustrative embodiments of the present invention referring to the appropriate selection of the lateral dimensions 234, 235 and 236 with respect to the corresponding etch depths 237, 238 and 239 will be described in more detail with reference to FIGS. 3 and 4.

Again referring to FIG. 2*a*, after the formation of the resist layer 208 with the openings 230, 231 and 232 having lateral dimensions depending on the respective etch depths, an anisotropic etch process is performed, wherein the etch rate within the corresponding openings 230, 231 and 232 is influenced by the respective lateral dimensions for a given etch recipe. In this respect, an etch recipe is to be understood as the sum of all parameters defining a reactive plasma ambient to which the semiconductor device 200 is exposed. That is, the etch recipe determines the type of etch tool, i.e., the chamber geometry, the plasma density including the kinetic energy of the plasma particles, the fraction of the ionized and non-ionized particles, the type of reactant and carrier gases used, the chamber pressure which also determines the mean free path length and the like. Thus, the etch recipe defines a global etch rate for a specified material or materials and also determines the selectivity, that is, the etch rate difference of two different materials. As previously pointed out, the local etch rate may depend on the specifics of the structure to be formed and, therefore, the etch recipe may correspondingly be altered with respect to a specific circuit layer to be etched, even though the type of material to be etched may be the same in different device layers so as to account for local etch rate variations, which are per se highly undesirable.

After the selection of specified etch parameters, that is, a specified etch recipe, substantially determining the global etch rate, the local etch rate within the openings 230, 231 and 232 is significantly influenced by the corresponding lateral dimensions and due to the low aspect ratio of the opening 230 compared to the relatively high aspect ratio of the opening 231, material of the insulating layer 207 is removed in the opening 230 faster than in the opening 231. Similarly, material in the opening 232 is removed more slowly than in the opening 230 but faster than in the opening 231. During the etch procedure, the aspect ratios of the openings 230, 231 and 232 steadily increase, although at different rates, thereby slowing down the material removal in all of the openings, while still maintaining a difference in the etch rate due to the still different aspect ratios at each time point of the etch process. Consequently, the etch front may reach the bulk substrate 202 below the opening 230, while the etch front is in the vicinity of the surface of the gate electrode 211 below the opening 231 and is in the vicinity of the surface of the active layer 204 below the opening 232. Thus, for a given selectivity of the etch recipe with respect to silicon dioxide and silicon, the present invention allows one to "virtually" increase the selectivity ratio, since the etch front reaches the silicon regions substantially at the same time or at least within a certain time interval, depending on the accuracy of adapting the lateral dimensions 234, 235 and 236 to the corresponding etch depths 237, 238 and 239. Conventionally, the etch front typically reaches the gate electrode 211 first and removes silicon, preceded by silicide removal when a silicide region is formed on the gate electrode 211, according to the silicon dioxide/silicon selectivity ratio until finally the etch front reaches the silicon layer 202, thereby possibly damaging the gate electrode structure. The time interval defined by the point in time the etch front reaches the gate electrode 211 and the point in time the front reaches the bulk substrate 202 is thus reduced compared to the conventional approach so that the silicon of the gate electrode 211 is exposed less to the reactive atmosphere. This is what is meant by the statement that the etch selectivity is "virtually" increased.

Figure 2B:
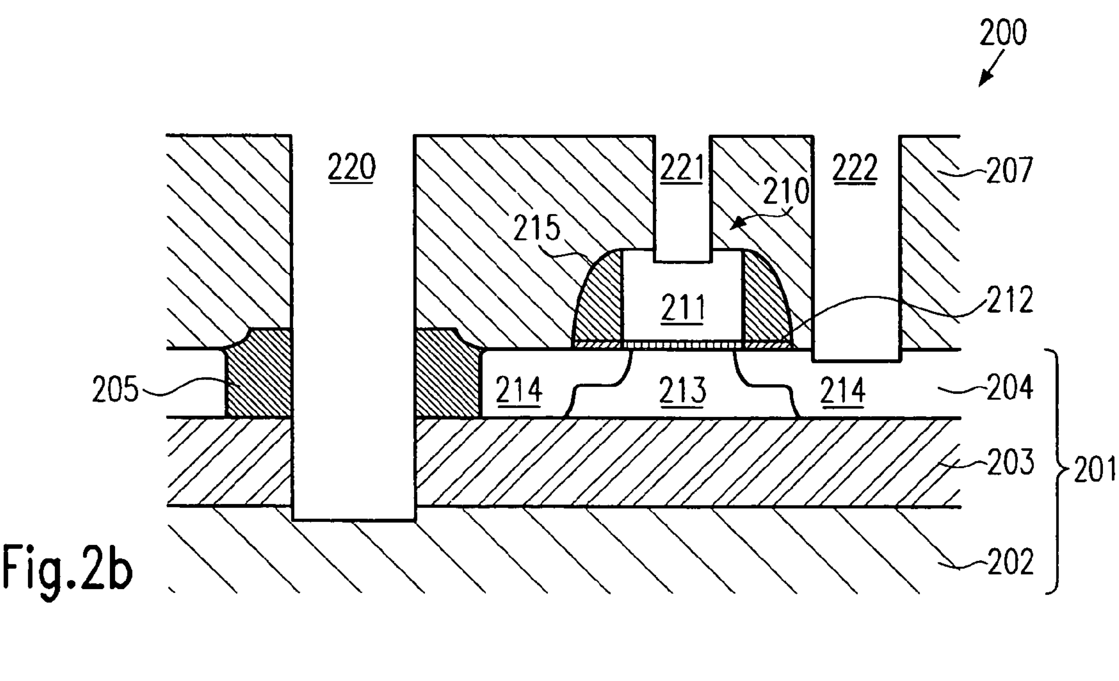

FIG. 2*b* schematically shows the semiconductor device 200 after completion of the three-level etch process with etch rate control by means of aspect ratio adaptation of contact openings. Thus, the semiconductor device 200 comprises a substrate contact opening 220 connecting to the bulk substrate 202, a first contact opening 221 connecting to the gate electrode 211 and a second contact opening 222 connecting to the source region 214.

Thereafter, the substrate contact opening 220, the first and the second contact openings 221 and 222 may be filled with a conductive material such as tungsten in a common fill process so as to form highly conductive contact plugs. The excess material can then be removed by chemical mechanical polishing as is known from the conventional SOI contact plug formation technique.

With reference to FIGS. 3*a*–3*c* and 4, techniques will be described in more detail so as to control a local etch rate by adapting an aspect ratio in accordance with further illustrative embodiments of the present invention.

Figure 3A:
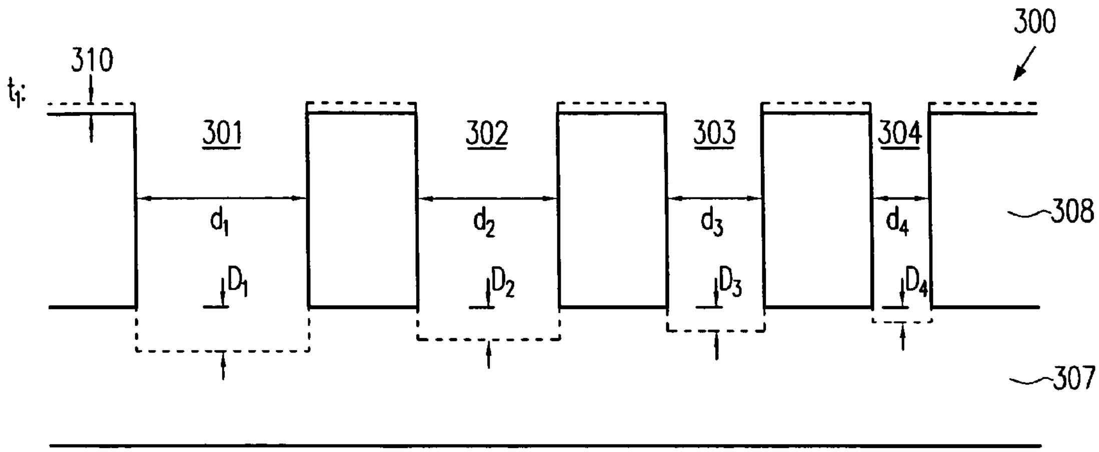
FIGS. 3*a*–3*c* schematically show cross-sectional views of a test structure during an etch process at three different time points to estimate an aspect ratio dependent etch rate according to illustrative embodiments of the present invention.

FIG. 3*a* schematically shows a semiconductor structure 300 including a dielectric layer 307 comprised of a material that is to be etched in an actual product substrate. For instance, the dielectric layer 307 may be comprised of silicon dioxide. A resist layer 308 is formed above the dielectric layer 307 with openings 301, 302, 303 and 304 having corresponding lateral dimensions $d_1$, $d_2$, $d_3$ and $d_4$. The semiconductor structure 300 is shown after exposure to a plasma etch atmosphere established in accordance with a specified etch recipe, wherein the semiconductor structure 300 has been exposed for a time interval $t_1$. Owing to the exposure to the reactive plasma atmosphere, material of the resist layer 308 has been removed, as is denoted by 310, and also material of the dielectric layer 307 within the openings 301, 302, 303 and 304 is removed in accordance with a local etch rate defined by the currently existing aspect ratio of the respective openings. The corresponding amounts of material removal are represented by the corresponding etch depths that are denoted as $D_1$, $D_2$, $D_3$ and $D_4$, respectively.

It should be noted that the semiconductor structure 300 is of an illustrative nature only and it may contain more than four openings with different aspect ratios. Moreover, a plurality of semiconductor structures 300 may be provided on a test substrate so as to obtain a plurality of measurement results. In one typical example, an initial thickness of the resist layer 308 may range from approximately 0.5–1.0 μm and the lateral dimensions of the openings 301, 302, 303 and 304 may range from approximately 0.5 μm for $d_1$ to approximately 0.1 μm for $d_4$, with $d_2$, $d_3$ having intermediate values. For high-end semiconductor devices, the minimum lateral dimension may range to 0.08 μm or even less. Preferably, the values for the respective lateral dimensions of the openings 301, 302, 303 and 304 are selected within a range that covers the range of allowable dimensions compatible with the design rules.

As is previously pointed out, design rules for the trench isolation structure 205 and/or the transistor 210 in combination with conductivity considerations may not permit exceeding or missing certain limits for the lateral dimensions.

Figure 3B:
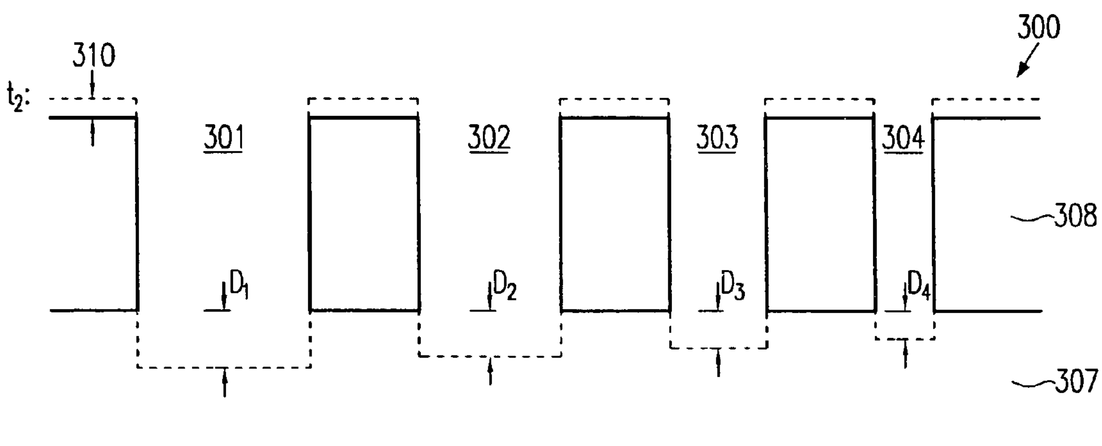

FIG. 3*b* schematically shows the semiconductor structure 300 after having been exposed to the reactive plasma atmosphere for a time interval $t_2$. As is evident from FIG. 3*b*, the material removal 310 of the resist layer 308 as well as the corresponding etch depths $D_1$, $D_2$, $D_3$ and $D_4$ of the dielectric layer 307 are correspondingly increased.

Figure 3C:
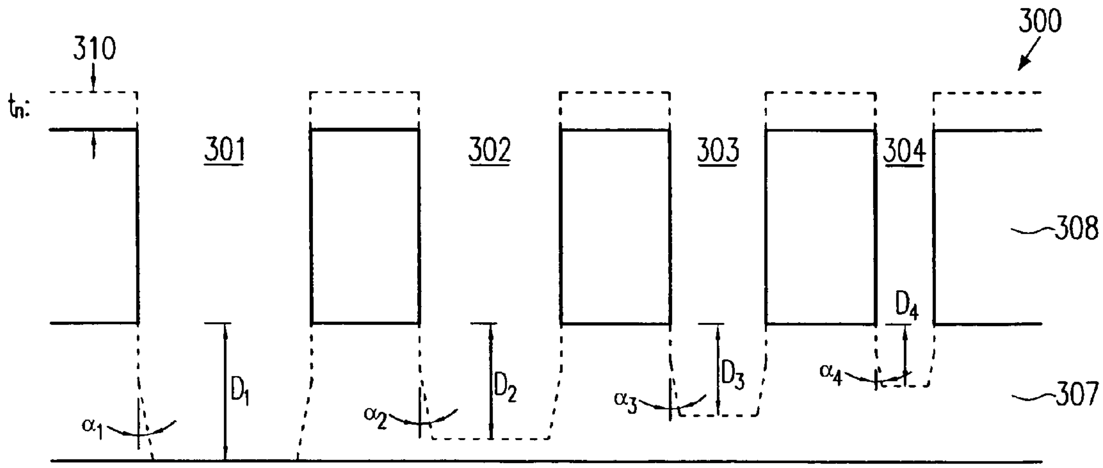

FIG. 3*c* schematically depicts the semiconductor structure 300 after having been exposed to the reactive plasma atmosphere for a time interval $t_n$, wherein it is assumed that intermediate measurements may have been performed between $t_2$ and $t_n$. As can be seen, respective openings are formed in the dielectric layer 307 indicated by the respective etch depths $D_1$, $D_2$, $D_3$ and $D_4$ after the time interval $t_n$, wherein also the slope of the sidewalls of these openings are determined and are indicated by respective angles $\alpha$1, $\alpha$2, $\alpha$3 and $\alpha$4. As previously explained, due to the initially very different aspect ratios of the openings 301, 302, 303 and 304, which may increase during the etch process, quite different etch depths are obtained at the final time $t_n$. Moreover, the different etch behaviors in the corresponding openings may affect the sidewall profile of the openings, which is taken account of by determining the respective angle formed between the vertical direction and the slope of the sidewall.

Figure 4:
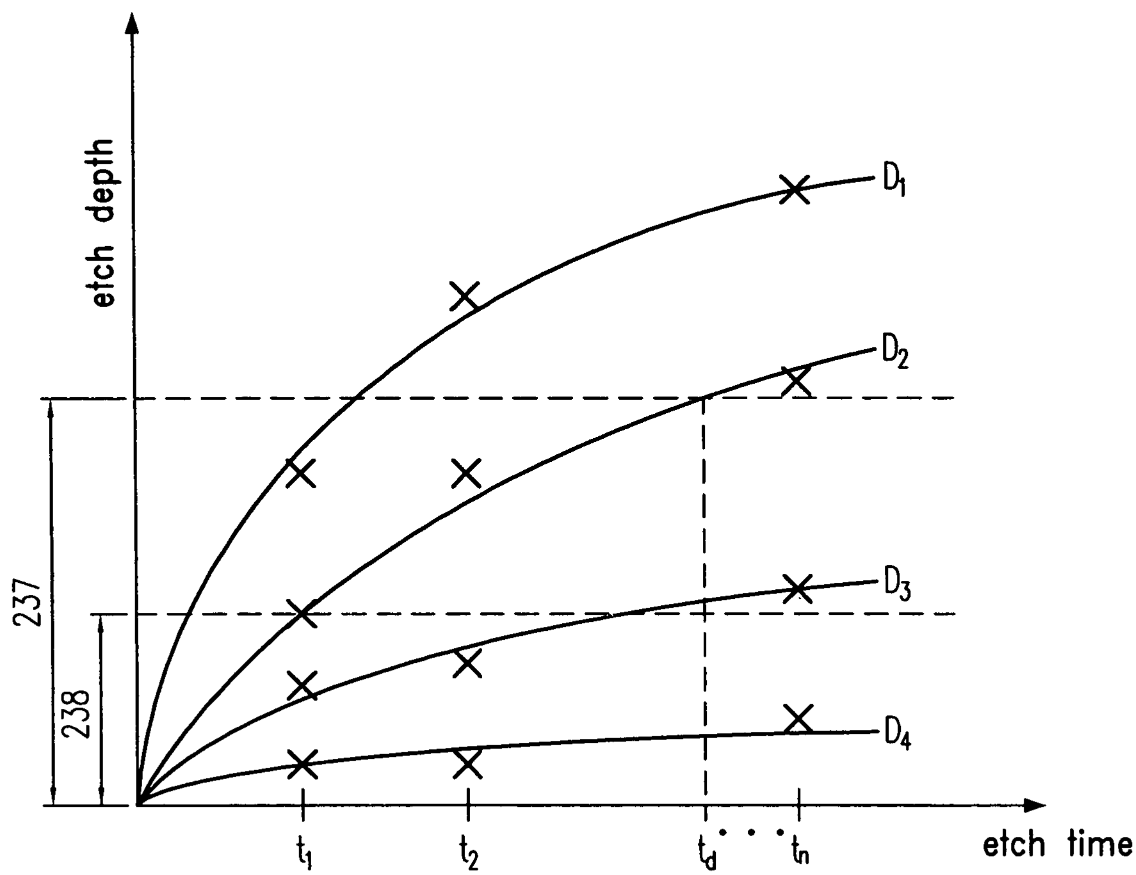
FIG. 4 schematically shows a graph representing the measurement results obtained from FIGS. 3*a*–3*c*.

FIG. 4 schematically shows a graph representing results of the measurements in conformity with FIGS. 3*a*–3*c*. Thus, FIG. 4 illustrates the etch time on the horizontal axis and the corresponding etch depth on the vertical axis. The respective etch depths $D_1$, $D_2$, $D_3$ and $D_4$ are plotted at the various times $t_1$, $t_2$ . . . $t_n$, wherein, for convenience sake, the resulting curves connecting the individual measurement points are also indicated by the same reference sign as the corresponding etch depth. Hence, FIG. 4 shows a curve $D_1$, indicating that the etch depth in the opening 301 rapidly increases at the beginning of the etch process and then slows down, according to the increase of the aspect ratio during the progression of the etch process, to result in a certain etch depth at the final time $t_n$. Similar curves $D_2$, $D_3$ and $D_4$ are obtained for the openings 302, 303 and 304, respectively. It should be noted that any type of appropriate data manipulation may be applied to the measurement data obtained from the etch procedure shown in FIGS. 3*a*–3*c* including interpolation, data fitting and the like to obtain relatively smooth curves $D_1$, . . . $D_4$. Moreover, the corresponding etch depths may be determined at a large number of time points, depending on the available resources for taking measurement data. Suitable measurement techniques for gathering the measurement data $D_1$, . . . $D_4$ and/or $\alpha_1$, . . . $\alpha_4$ may include electron microscopy, optical measurement techniques, and the like. In other cases, the measurement data obtained from the etch procedure of FIGS. 3*a*–3*c* may be combined with simulation results of anisotropic etch models to establish, representative, curves for a plurality of contact holes, geometries and a plurality of process recipes. For instance, the etch process described with reference to FIGS. 3*a*–3*c* may be performed with a plurality of different etch recipes so as to establish a library that conveniently allows assigning a specific lateral dimension to a given etch depth with a desired etch recipe.

After having established representative curves for one or more specified etch recipes, the required aspect ratio of a contact hole, i.e., a required lateral dimension within a resist mask for a given etch depth, may then be estimated. For the semiconductor device 200, as shown in FIG. 2*a*, and the exemplary etch depth curves of FIG. 4, the etch depth 237 for the substrate contact opening may be indicated in FIG. 4 along with, for example, the etch depth 238 for the contact opening 221. As can be seen from FIG. 4, the etch depth 237 may be reached, for example, with the curve $D_2$ at an etch time $t_d$. Moreover, the etch depth 238 may be reached in a similar time $t_d$ when following the curve $D_3$. Thus, by selecting the aspect ratio of the substrate contact opening 220 defined by $d_2$ and the depth 237 and an aspect ratio for the contact opening 221 defined by $d_3$ and the etch depths 238 for a given etch recipe, wherein the remaining parameters of the resist layer 208 correspond to the resist layer 308, that is, layer thickness and composition are substantially the same, the openings 220 and 221 may be formed in a common etch process, wherein the etch front reaches the respective final depth at substantially the same time $t_d$.

In a similar way, the aspect ratio of the contact opening 222 may be selected so as to conform with the measurement results in FIG. 4. As may readily be appreciated, a plurality of other combinations of aspect ratios may be obtained from FIG. 4. For instance, the substrate contact opening 220 may be formed by following the curve $D_1$, requiring a lateral dimension, that is, an aspect ratio that lies between $d_2$ and $d_3$ in FIGS. 3*a*–3*c*. The corresponding lateral dimension may be obtained by, for example, interpolating a plurality of curves between the curve $D_2$ and $D_3$ in FIG. 4. If the measurement data obtained from the etch procedure of FIGS. 3*a*–3*c* are combined with a simulation algorithm, the aspect ratios, i.e., the initial lateral dimensions of the openings 230, 231 and 232 in the resist layer 208, may be conveniently obtained by calculation. Preferably, by selecting appropriate candidates for the aspect ratios of the openings 220, 221 and 222, further criteria may be taken into consideration. In one embodiment, the sidewall profile, represented by the angle $\alpha$1 . . . , $\alpha$4 in FIG. 3*c*, may be taken account of by selecting that combination of aspect ratios that results in a desired sidewall profile. In other cases, an appropriate criterion for selecting representative aspect ratios may be a maximum conductivity, i.e., maximum lateral dimensions of all contact openings 220, 221, 222, which nevertheless conform to the limitations dictated by design requirements.

In other embodiments of the present invention, additionally, the influence of the aspect ratio on the selectivity of the etch process may be determined. To this end, a similar etch procedure as described with reference to FIGS. 3*a*–3*c* may be performed, wherein the layer 307 may be comprised of a different material the selectivity to which is to be determined. For instance, the layer 307 may be comprised of silicon and the respective etch depths $D_1$, $D_2$, $D_3$ and $D_4$ may represent, in combination with the results obtained by etching the layer 307 comprised of silicon dioxide, the respective etch selectivity dependent on the aspect ratio. Since a maximum selectivity is still desirable in forming the contact openings 220, 221 and 222, the aspect ratios may then be selected so as to assure, a high local-selectivity within each of the openings 220, 221 and 222.

As a result, the present invention allows one to virtually increase the etch selectivity in a multi-level etch process by locally controlling the etch rate by correspondingly adapting the aspect ratios of the finally obtained contact openings, that is, by correspondingly adapting the lateral dimensions of openings in a resist mask with respect to the finally required etch depth of the respective openings. The adaptation of the aspect ratios may further be performed under secondary conditions such as design requirements, desired conductivity, desired etch profile of the openings, local selectivity, and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

defining a lateral dimension for a given first depth of a first contact opening and a second lateral dimension for a given second depth of a second contact opening, wherein said first depth is greater than said second depth;

forming a resist mask over a dielectric layer in which said first and second openings are to be formed, said resist mask having a first opening with said first lateral dimension and a second opening with said second lateral dimension, wherein said first lateral dimension is greater than said second lateral dimension; and etching said first and second contact openings through said first and second openings in said resist mask into said dielectric layer, wherein a local etch rate of a specified anisotropic etch recipe is controlled by said first and second lateral dimensions of said openings in said resist mask so as to reach said first and second depth within a predefined time interval.

2. The method of claim 1, further comprising determining etch depth data for said specified etch recipe for a plurality of openings having different lateral dimensions for a plurality of etch times.

3. The method of claim 2, further comprising estimating said first and second lateral dimensions on the basis of said etch depth data.

4. The method of claim 1, further comprising forming a third opening in said dielectric layer in a common etch process with said first and second openings, wherein said third opening extends to a third depth that is less than said second depth and greater than said first depth.

5. The method of claim 4, wherein a third lateral dimension of said third opening is selected so as to be within an interval defined by said first and second lateral dimensions.

6. The method of claim 5, wherein said third lateral dimension is determined on the basis of said etch depth data.

7. The method of claim 2, further comprising assessing a sidewall profile of said plurality of openings.

8. The method of claim 7, further comprising defining said first and second lateral dimensions on the basis of said sidewall profile assessment.

9. The method of claim 1, further comprising determining an etch selectivity for said dielectric layer with respect to a material located at said first and second depths for a plurality of openings having different lateral dimensions and being formed according to said specified etch recipe.

10. The method of claim 9, wherein said first and second lateral dimensions are defined so as to provide a predefined minimum etch selectivity at one of said first and second depths.

11. The method of claim 1, wherein said dielectric layer is formed above an SOI substrate including at least one trench isolation structure and a circuit element enclosed by said trench isolation structure.

12. The method of claim 11, wherein said first contact opening is formed through said trench isolation structure and said second contact opening is formed to connect to said circuit element.

13. The method of claim 12, further comprising defining said first and second lateral dimensions on the basis of design rules determining the dimensions of said trench isolation structure and said circuit element.

14. The method of claim 12, further comprising defining said first and second lateral dimensions on the basis of a required conductivity of a contact plug to be formed in said first and second contact openings.

15. A method of defining lateral dimensions of at least two contact openings of different depths to be formed in a common etch process in a dielectric layer, the method comprising:

determining an etch rate of said common etch process for a plurality of openings having a different lateral dimension;

defining an allowable time interval within which said common etch process has to reach the different depths; and estimating an actual lateral dimension for each of said at least two contact openings on the basis of said determined etch rates, wherein said actual lateral dimensions allow reaching of said different depths within said allowable time interval.

16. The method of claim 15, wherein determining said etch rates includes obtaining an etch depth for a plurality of openings having a different lateral dimension for said common etch process for different etch times.

17. The method of claim 16, further comprising comparing said different depths of said at least two contact openings with said etch depths and selecting said actual lateral dimensions on the basis of said comparison.

18. The method of claim 16, wherein said etch depths are obtained by experiment.

19. The method of claim 16, wherein said etch depths are obtained by simulation on the basis of a model of said common etch process.

20. The method of claim 16, wherein said etch depths are obtained by experiment and simulation.

21. The method of claim 15, further comprising estimating said actual lateral dimensions on the basis of at least one of chip area available in the lateral direction, sidewall profile of said at least two contact openings, conductivity of a contact plug to be formed in said at least two contact openings and etch behavior with respect to a material other than said dielectric layer.

22. A method, comprising:

defining a lateral dimension for a given first depth of a first contact opening and a second lateral dimension for a given second depth of a second contact opening, said first depth differing from said second depth;

forming a resist mask over a dielectric layer in which said first and second openings are to be formed, said resist mask having a first opening with said first lateral dimension and a second opening with said second lateral dimension;

etching said first and second contact openings through said first and second openings in said resist mask into said dielectric layer, wherein a local etch rate of a specified anisotropic etch recipe is controlled by said first and second lateral dimensions of said opening in said resist mask; and forming a third opening in said dielectric layer in a common etch process with said first and second openings, wherein said third opening extends to a third depth that is less than said second depth and greater than said first depth.

23. The method of claim 22, wherein a third lateral dimension of said third opening is selected so as to be within an interval defined by said first and second lateral dimensions.

24. The method of claim 23, wherein said third lateral dimension is determined on the basis of said etch depth data.

25. A method, comprising:

defining a lateral dimension for a given first depth of a first contact opening and a second lateral dimension for a given second depth of a second contact opening, said first depth differing from said second depth;

forming a resist mask over a dielectric layer in which said first and second openings are to be formed, said resist mask having a first opening with said first lateral dimension and a second opening with said second lateral dimension;

etching said first and second contact openings through said first and second openings in said resist mask into said dielectric layer, wherein a local etch rate of a specified anisotropic etch recipe is controlled by said first and second lateral dimensions of said opening in said resist mask; and determining an etch selectivity for said dielectric layer with respect to a material located at said first and second depths for a plurality of openings having different lateral dimensions and being formed according to said specified etch recipe.

26. The method of claim 25, wherein said first and second lateral dimensions are defined so as to provide a predefined minimum etch selectivity at one of said first and second depths.

27. The method of claim 25, further comprising forming a third opening in said dielectric layer in a common etch process with said first and second openings, wherein said third opening extends to a third depth that is less than said second depth and greater than said first depth.

28. The method of claim 27, wherein a third lateral dimension of said third opening is selected so as to be within an interval defined by said first and second lateral dimensions.

* * * * *